(12) United States Patent
Thacker et al.

(10) Patent No.: US 9,678,271 B2
(45) Date of Patent: Jun. 13, 2017

(54) PACKAGED OPTO-ELECTRONIC MODULE

(71) Applicant: Oracle International Corporation, Redwood City, CA (US)

(72) Inventors: Hiren D. Thacker, San Diego, CA (US); Ashok V. Krishnamoorthy, San Diego, CA (US); Xuezhe Zheng, San Diego, CA (US); John E. Cunningham, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 303 days.

(21) Appl. No.: 14/605,650

(22) Filed: Jan. 26, 2015

(65) Prior Publication Data
US 2016/0216445 A1 Jul. 28, 2016

(51) Int. Cl.
| | | |
|---|---|---|
| H04B 10/00 | (2013.01) | |
| G02B 6/12 | (2006.01) | |
| H01L 25/16 | (2006.01) | |
| H01L 23/498 | (2006.01) | |
| G02B 6/30 | (2006.01) | |
| G02B 6/32 | (2006.01) | |
| G02B 6/42 | (2006.01) | |

(Continued)

(52) U.S. Cl.
CPC ........... *G02B 6/12004* (2013.01); *G02B 6/30* (2013.01); *G02B 6/32* (2013.01); *G02B 6/4219* (2013.01); *G02B 6/4257* (2013.01); *G02B 6/4274* (2013.01); *H01L 23/49827* (2013.01); *H01L 23/49838* (2013.01); *H01L 23/49894* (2013.01); *H01L 25/167* (2013.01); *H04B 10/803* (2013.01); *G02B 2006/12061* (2013.01); *G02B 2006/12142* (2013.01); *H01L 2224/16225* (2013.01); *H01L 2924/0002* (2013.01); *H01L 2924/15311* (2013.01)

(58) Field of Classification Search
CPC .............................. H04B 10/50; H04B 10/501
See application file for complete search history.

(56) References Cited

U.S. PATENT DOCUMENTS

| | | | |
|---|---|---|---|
| 6,749,345 B1 * | 6/2004 | Gee ........................ | G02B 6/421 385/75 |
| 2005/0156310 A1 | 7/2005 | Benner et al. | |
| 2005/0196177 A1 * | 9/2005 | Moran ................. | H04B 10/504 398/182 |

FOREIGN PATENT DOCUMENTS

WO 2013074103 A1 5/2013

\* cited by examiner

*Primary Examiner* — Daniel Dobson
(74) *Attorney, Agent, or Firm* — Park, Vaughan, Fleming & Dowler LLP

(57) ABSTRACT

A chip package includes an optical integrated circuit (such as a hybrid integrated circuit) and an integrated circuit that are proximate to each other in the chip package. The integrated circuit includes electrical circuits that modulate data, communicate data, and serialize/deserialize data, and the optical integrated circuit communicates optical signals with very high bandwidth. Moreover, a front surface of the integrated circuit is electrically coupled to a top surface of an interposer, and a top surface of the integrated circuit is electrically coupled to a front surface of the optical integrated circuit. Furthermore, a bottom surface of the optical integrated circuit faces the top surface of the interposer, and the front surface of the optical integrated circuit is optically coupled to an optical-fiber receptacle, which in turn is optically coupled to an optical-fiber connector.

20 Claims, 8 Drawing Sheets

(51) Int. Cl.
*H04B 10/80* (2013.01)
*H04J 14/00* (2006.01)

PACKAGED OPTO-ELECTRONIC MODULE

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure generally relates to a chip package that accommodates semiconductor chips. More specifically, the present disclosure relates to a hybrid-integrated chip package that includes an interposer with adjacent payload and photonic chips.

Related Art

As integrated-circuit (IC) technology continues to scale to smaller critical dimensions, it is increasingly difficult for existing interconnection technologies to provide suitable communication characteristics, such as: high bandwidth, low power, reliability and low cost. Engineers and researchers are investigating a variety of interconnect technologies to address these problems, and to enable future high-density, high-performance systems.

One interconnect technology to address these challenges, which is the subject of ongoing research, is optical communication. In principle, optical communication can be used to communicate large amounts of data. However, while photonic technologies based on vertical cavity surface-emitting lasers (VCSELs) and optical fibers are typically a convenient and cost-effective solution to communicate modest amounts of data in certain parts of systems (such as between racks and, in certain cases, between boards within a rack), it is often difficult to scale these photonic components to meet the bandwidth, size, and power requirements of input/output (I/O) interfaces for future chips.

Alternatively, optical interconnects or links based on silicon photonics are attractive candidates for interconnect technology because they can be readily scaled on optical integrated circuits. Even though vertical-cavity surface-emitting laser (VCSEL)-based optical interconnect modules are being integrated on the motherboard situated only centimeters from computing or payload integrated circuits, it can be difficult to integrate optical integrated circuits with conventional integrated circuits in existing chip packages.

Hence, what is needed is a chip package that does not suffer from the above-described problems.

SUMMARY

One embodiment of the present disclosure provides a chip package that includes an integrated circuit having a front surface with first integrated-circuit connector pads and second integrated-circuit connector pads, where the integrated circuit modulates data, communicates data, and serializes/deserializes data. Moreover, the chip package includes: first integrated-circuit electrical connectors electrically coupled to the first integrated-circuit connector pads; and an interposer having a bottom surface and a top surface, facing the front surface of the integrated circuit, with first interposer connector pads, electrically coupled to the first integrated-circuit electrical connectors. Furthermore, the chip package includes: second integrated-circuit electrical connectors electrically coupled to the second integrated-circuit connector pads; and an optical integrated circuit having a bottom surface, facing the top surface of the interposer, and a top surface, facing the front surface of the integrated circuit, with first optical-integrated-circuit connector pads electrically coupled to the second integrated-circuit electrical connectors, where the optical integrated circuit communicates optical signals. In addition, the chip package includes: an optical-fiber receptacle having a first surface and a second surface, where the first surface is mechanically and optically coupled to the top surface of the optical integrated circuit; and an optical-fiber connector mechanically and optically coupled to the second surface of the optical-fiber receptacle.

Note that the optical integrated circuit may include second optical-integrated-circuit connector pads on the bottom surface of the optical integrated circuit, and the interposer may include second interposer connector pads on the top surface of the interposer. Additionally, the chip package may include optical-integrated-circuit electrical connectors electrically coupled to the second optical-integrated-circuit connector pads and the second interposer connector pads.

In some embodiments, the interposer includes a cavity defined by a surface, and the optical integrated circuit is at least partially included in the cavity.

Moreover, the optical-fiber receptacle may include a lens on at least one of: the first surface, and the second surface. Furthermore, the optical-fiber receptacle may include: first alignment features on the first surface to facilitate alignment between the optical-fiber receptacle and the top surface of the optical integrated circuit; and second alignment features on the second surface to facilitate alignment between the optical-fiber receptacle and the optical-fiber connector.

Additionally, the optical-fiber connector may include a vertical optical-fiber connector that mechanically and optically couples to an optical fiber along a direction perpendicular to a plane of the interposer. Alternatively, the optical-fiber connector may include a horizontal optical-fiber connector that mechanically and optically couples to an optical fiber along a direction in a plane of the interposer.

Note that the integrated circuit may perform one of: transmitting data, receiving data, and transmitting and receiving data. In embodiments where the first integrated circuit transmits data, the chip package may include: a second integrated circuit having a front surface with third integrated-circuit connector pads and fourth integrated-circuit connector pads, where the second integrated circuit receives data; third integrated-circuit electrical connectors electrically coupled to the third integrated-circuit connector pads and second interposer connector pads on the top surface of the interposer; and fourth integrated-circuit electrical connectors electrically coupled to the fourth integrated-circuit connector pads and second optical-integrated-circuit connector pads on the top surface of the optical integrated circuit.

Moreover, with the exception of the optical fiber connector, the chip package may be solder-reflow compatible up to temperatures as high as 260 C.

In some embodiments, the chip package includes a substrate thermally and electrically coupled to the bottom surface of the interposer. The interposer may include through-interposer vias electrically coupling the bottom surface of the interposer and the top surface of the interposer.

Moreover, the optical integrated circuit may be implemented using silicon-on-insulator technology.

Furthermore, the interposer may include: an organic material, a ceramic, glass, and/or a semiconductor.

Another embodiment provides a system that includes a processor, a memory coupled to the processor and the chip package.

Another embodiment provides a method for communicating electrical signals between the integrated circuit and the optical integrated circuit. During the method, digital electrical signals are coupled from the interposer connection pads on the top surface of the interposer to the first integrated-circuit connector pads on the front surface of the integrated circuit. Then, the digital electrical signals are converted to analog electrical signals. Moreover, the analog electrical signals are coupled from the second integrated-circuit connector pads on the front surface of the integrated circuit to the optical-integrated-circuit connector pads on the top surface of the optical integrated circuit. Next, optical signals are generated based on the analog electrical signals. Furthermore, the optical signals are communicated to the optical fiber via the optical-fiber receptacle and the optical-fiber connector.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
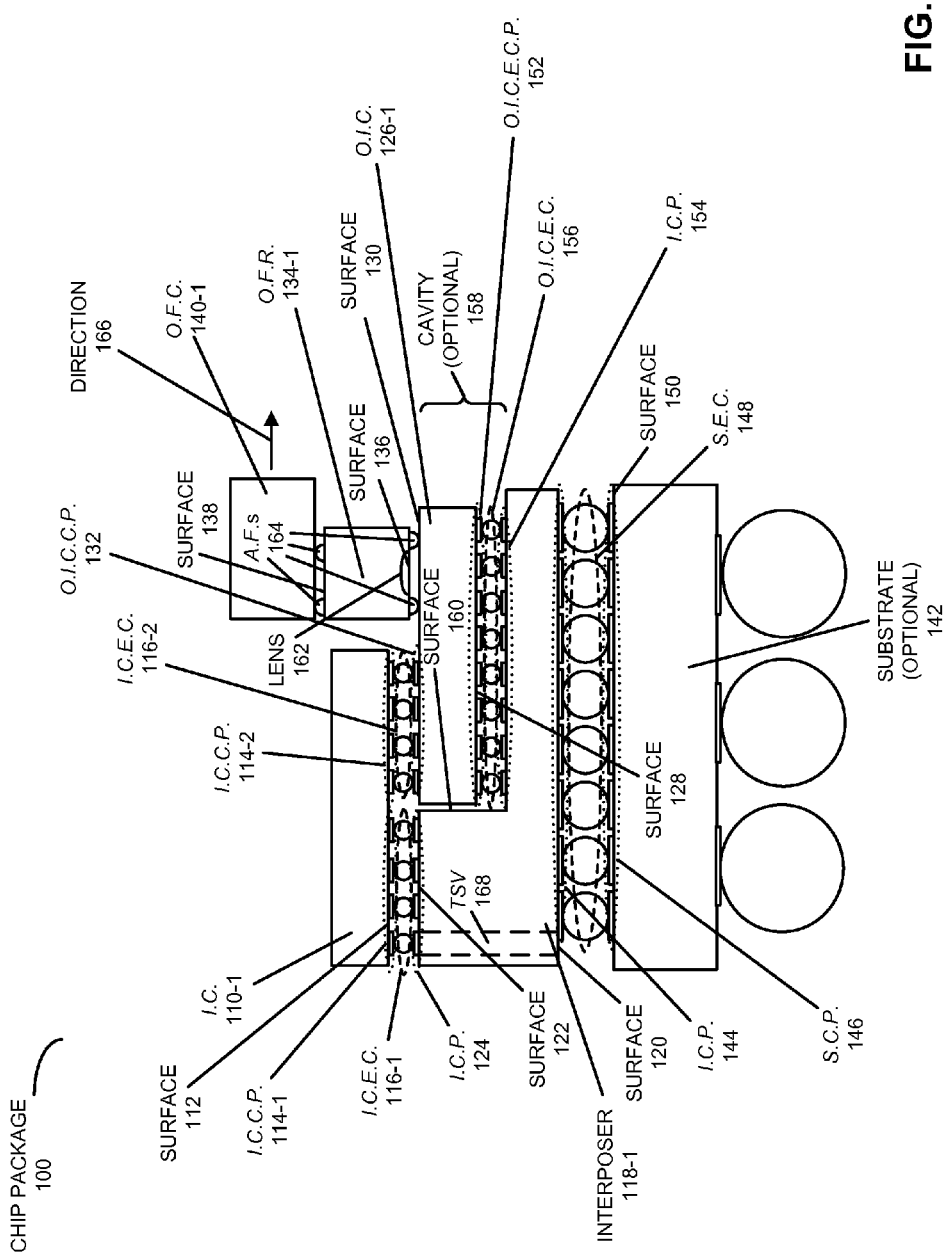
FIG. 1 is a block diagram illustrating a side view of a chip package with a packaged opto-electronic module (POEM) in accordance with an embodiment of the present disclosure.

Embodiments of a chip package, a system that includes the chip package, and a technique for communicating electrical signals between an integrated circuit and an optical integrated circuit in the chip package are described. This chip package includes an optical integrated circuit (such as a hybrid integrated circuit) and an integrated circuit that are proximate to each other in the chip package. The integrated circuit includes electrical circuits that modulate data, communicate data, and serialize/deserialize data, and the optical integrated circuit communicates optical signals with very high bandwidth. Moreover, a front surface of the integrated circuit is electrically coupled to a top surface of an interposer, and a top surface of the integrated circuit is electrically coupled to a front surface of the optical integrated circuit. Furthermore, a bottom surface of the optical integrated circuit faces the top surface of the interposer, and the front surface of the optical integrated circuit is optically coupled to an optical-fiber receptacle, which in turn is optically coupled to an optical-fiber connector.

By integrating the optical integrated circuit and the integrated circuit in close proximity, the chip package may facilitate improved performance compared to chip packages with electrical interconnects. In particular, the chip package may provide multi-terabit per second optical communication in conjunction with high-performance electrical circuits by using a high-trace density interposer to indirectly electrically couple the integrated circuit and the optical integrated circuit. In this way, the chip package may meet the escalating demands of off-chip bandwidth, while providing higher bandwidth density and improved energy efficiency compared to electrical interconnects.

We now describe the chip package. As the total off-chip bandwidth from a VLSI chip approaches 10 Tbps and beyond, the pin count and line speed of existing electrical input/output (I/O) solutions set physical limitations on the total data communication capacity from existing packaging and printed-circuit-board interconnect technologies. Optical communication is increasingly being used inside systems closer and closer to the VLSI chip for communicating large amounts of data. For example, electrical-to-optical conversion in current and next generation systems may occur in the mid-board optical modules that are situated close to the VLSI switch and/or processor chip. This architecture may help remove speed and wiring bottlenecks on the printed circuit board, and may increase the efficiency of communication. However, these systems may ultimately require that such electrical-to-optical conversion occur within the ASIC package because of pinout limitations that constrain the bandwidth-density achievable with electrical I/O from the VLSI chip package.

In the following discussion, a chip package that includes one or more optoelectronic modules (which are sometimes referred to as 'packaged opto-electronic modules' or POEMs) is described. This chip package provides a modular architecture that enables better testability and improved yield compared to a true multi-chip module configuration. Moreover, using this architecture high-speed optical I/Os are placed physically closer to the VLSI integrated circuit to meet the escalating demands of off-chip bandwidth. Consequently, the optical interconnects may achieve a higher bandwidth density and better energy efficiency compared to electrical interconnects, especially with the use of wavelength division multiplexing. Note that the chip package may use hybrid integration to combine silicon photonic devices and VLSI circuits. In particular, the chip package may include hybrid-integrated electronic-photonic elements or components in which the electronics and photonics are built on individually optimized technology platforms and then bonded together using a low-parasitic flip-chip-assembly technique, such as thermocompression or reflow bonding.

FIG. 1 presents a block diagram illustrating a side view of a chip package 100 that includes a POEM. In chip package 100, integrated circuit (I.C.) 110-1 (which may be integrated adjacent or proximate to a switch chip, a high-density memory stack or a high-performance processor in the chip package that requires ultrahigh off-chip bandwidth, and which is sometimes referred to as a 'payload' or 'payload IC') may be flip-chip bonded (circuit-side down) to interposer 118-1. In addition, integrated circuit 110-1 may be electrically coupled to (an active side of) optical integrated circuit 126-1 (which is sometimes referred to as a 'photonic bridge chip' or a 'photonic IC'). Note that optical integrated circuit 126-1 communicates optical signals (which may involve transmitting the optical signals, receiving the optical signals, or both). For example, optical integrated circuit 126-1 may include modulators, multiplexers, demultiplexers, photodetectors, optical waveguides, optical-fiber couplers, etc. In addition, integrated circuit 110-1 modulates data, communicates data (using driver and receive circuits), and serializes/deserializes data. Therefore, integrated circuit 110-1 may include energy-efficient photonic driver and receiver circuits. For example, integrated circuit 110-1 may accept parallel data, serialize the data and encode the data onto a photonic-modulator driver signal. Conversely, integrated circuit 110-1 may accept serial electrical data from the photodetectors on optical integrated circuit 126-1, and may convert the electrical data into parallel data. In some embodiments, integrated circuit 110-1 includes multiple moderate-speed electrical links (e.g., 1-5 Gbps per channel) that communicate parallel data, and a smaller number of high-speed serial links to optical integrated circuit 126-1 (e.g., greater than 14 Gbps per channel). Thus, integrated circuit 110-1 may combine parallel channels into serial data streams to make the best use of the optical communication provided by optical integrated circuit 126-1. This combination may involve changing the communication-protocol format of data in the communicated electrical signals.

As shown in FIG. 1, chip package 100 may include: integrated circuit 110-1 having a surface 112 with integrated-circuit connector pads (I.C.C.P.) 114; integrated-circuit electrical connectors (I.C.E.C.) 116 electrically coupled to integrated-circuit connector pads 114; an interposer 118-1 having surfaces 120 and 122, facing surface 112 and with interposer connector pads (I.C.P.) 124 electrically coupled to integrated-circuit electrical connectors 116-1; optical integrated circuit 126-1 having surfaces 128 and 130, facing surfaces 122 and 112, and with optical-integrated-circuit connector pads (O.I.C.C.P.) 132 electrically coupled to integrated-circuit electrical connectors 116-2. Moreover, chip package 100 may include an optical-fiber receptacle 134-1, having surfaces 136 and 138, facing surface 130, which is mechanically and optically coupled to optical integrated circuit 126-1 away from the overlap with integrated circuit 110-1 and in a diving-board configuration. Furthermore, chip package 100 may include an optical-fiber connector (O.F.C.) 140-1 mechanically and optically coupled to surface 136 of optical-fiber receptacle (O.F.R.) 134-1. With the exception of optical fiber connector 140-1, the packaged opto-electronic module (POEM) in chip package 100 may be solder-reflow compatible up to temperatures as high as 260 C. Moreover, note that optical integrated circuit 126-1 is proximate to integrated circuit 110-1 on a same side of interposer 118-1.

In an exemplary embodiment, optical integrated circuit 126-1 is fabricated on a silicon-on-insulator substrate (such as a 0.1-0.5 μm or a 3 μm silicon-on-insulator technology platform). Moreover, interposer 118-1 may include: a ceramic, an organic material, a glass, and/or a semiconductor (such as silicon, silicon-on-insulator or silicon-germanium). In general, interposer 118-1 may have a coefficient of thermal expansion very close to silicon. This may provide thermo-mechanical latitude to use shorter and higher density bumps on chips, but also to bond chips very close together. In an exemplary embodiment, interposer 118-1 has a thickness between 100 μm and 1 mm. In general, connectors between components in chip package 100 may include: pads, bumps, solder balls and/or pillars (such as copper pillars).

Note that optical-fiber receptacle 134-1 may function as a beam-expanding optical adapter that serves as an optomechanical interface between optical integrated circuit 126-1 and optical-fiber connector 140-1. In particular, the beam-expansion characteristic of optical-fiber receptacle 134-1 may ease the physical alignment requirements between a single-mode output on optical-fiber receptacle 134-1 and a single-mode optical fiber that is optical-fiber connector 140-1. Optical-fiber receptacle 134-1 may be made of a variety of materials, such as: a glass with a low coefficient of thermal expansion, silicon, etc.

Furthermore, optical integrated circuit 126-1 may be hybrid integrated onto interposer 118-1. This hybrid integration may be achieved using a flip-chip attachment technique using thermocompression or reflow-bonded microbump technology. The bump and hybrid bond-pad sizes may be designed to minimize parasitic capacitance, such as C4-type solder interconnects (e.g., C4 bumps, lead-free bumps, copper-pillar bumps, etc.). Alternatively, compliant, rematable interconnects may be used instead of C4-type interconnects. This may facilitate rework and/or higher yield. After testing, a temporary connection may be made permanent using a low-temperature solder and/or an adhesive underfill. Note that optical integrated circuit 126-1 may be flip-chip attached to interposer 118-1 with a small or minimal gap between the two to minimize the electrical chip-to-chip interconnect wire length. Integrated circuit 110-1 may also be flip-chip attached to interposer 118-1. In general, the density of flip-chip interconnects may ultimately be constrained by physical limitations in the package-substrate manufacturing process. Note that the materials used in the interface between optical integrated circuit 126-1 and interposer 118-1 may be thermally conductive to spread the heat from optical integrated circuit 126-1.

Additionally, chip package 100 may include optional substrate 142 (such as a printed-circuit board, a ceramic, an organic, and/or glass), which may provide a backplane with power, ground, control, monitoring, etc., and which may function as a heat sink (i.e., optional substrate 142 may be thermally coupled to interposer 118-1). Interposer 118-1 may include interposer connector pads 144 on surface 120 of interposer 118-1 (which is on an opposite side of interposer 118-1 from surface 122). Interposer connector pads (I.C.P.) 144 may be electrically coupled to interposer connector pads 124 by through-substrate vias or TSVs, such as TSV 168 (or through-glass vias if interposer 118-1 includes glass). (For simplicity, only one TSV through interposer 118-1 is shown in FIG. 1) These TSVs may have widths of 50-200 μm. Note that interposer connector pads 144 may have a lower pitch than a pitch of the interposer connector pads 124. Thus, interposer 118-1 may facilitate a physical transformation of pad/bump pitch between the two sides of interposer 118-1.

Moreover, interposer connector pads 144 may be electrically coupled to substrate connector pads (S.C.P.) 146 on a surface 150 of optional substrate 142 by substrate electrical connectors (S.E.C.) 148.

Note that optical integrated circuit 126-1 may include optical-integrated-circuit electrical connector pads (O.I.C.E.C.P.) 152 on surface 128 of optical integrated circuit 126-1, and interposer 118-1 may include interposer connector pads (I.C.P.) 154 on surface 122 of interposer 118-1. Additionally, chip package 100 may include optical-integrated-circuit electrical connectors (O.I.C.E.C.) 156 electrically coupled to optical-integrated-circuit connector pads 152 and interposer connector pads 154. This electrical coupling may allow interposer 118-1 to provide power and ground to optical integrated circuit 126-1.

In some embodiments, interposer 118-1 includes an optional cavity 158 defined by a surface 160, and optical integrated circuit 126-1 is at least partially included in optional cavity 158. In these embodiments, shorter bumps may be used at the electrical interface between integrated circuit 110-1 and interposer 118-1. Alternatively, surface 122 of interposer 118-1 may be planar. In these embodiments, integrated-circuit electrical connectors 116 to interposer 118-1 may need to have a size equal the sum of the thickness of optical integrated circuit 126-1, the bondline between integrated circuit 110-1 and optical integrated circuit 126-1, and the bondline between optical integrated circuit 126-1 and interposer 118-1. This may require the use of special electrical bump structures, such as: tall pillars, dual bumps and/or a bump plus super pad.

Moreover, optical-fiber receptacle 134-1 may include a lens 162 (such as a micro-lens) and/or another optical component (such as a mirror) on at least one of surface 136 and 138. Furthermore, optical-fiber receptacle 134-1 may include: alignment features (A.F.) 164 on surface 136 to facilitate alignment between optical-fiber receptacle 134-1 and surface 130 of optical integrated circuit 126-1; and alignment features 164 on surface 138 to facilitate alignment between optical-fiber receptacle 134-1 and the optical-fiber connector 140-1. For example, alignment features 164 may include positive and/or negative features, such as: balls and pits, and/or pins and holes. Note that optical-fiber receptacle 134-1 and/or optical-fiber connector 140-1 may be aligned and attached to optical integrated circuit 126-1 using a high-precision pick and place operation (either at the die or wafer level). Note that this operation may occur before or after hybrid integration of integrated circuit 110-1 and optical integrated circuit 126-1.

Figure 2:
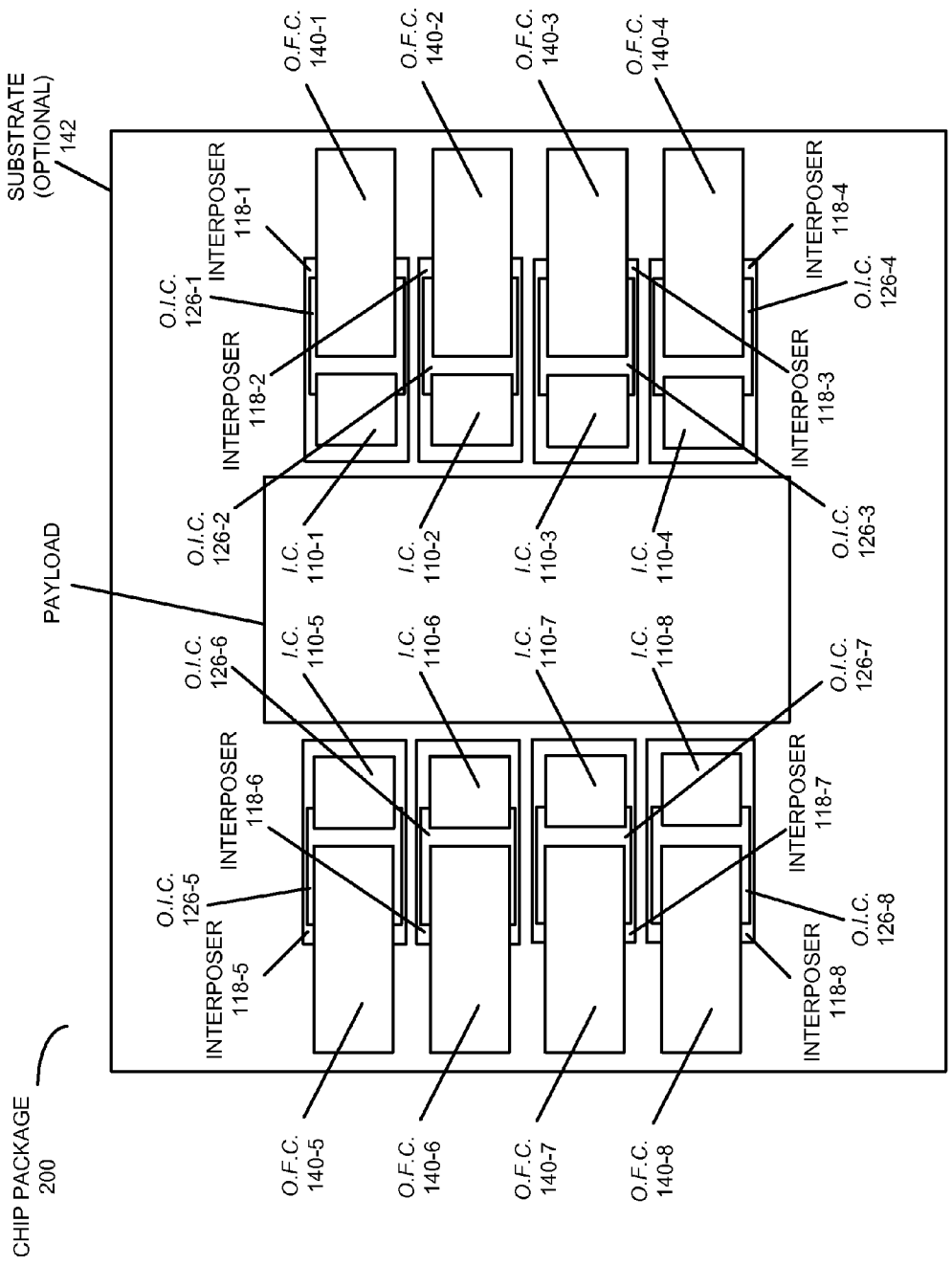
FIG. 2 is a block diagram illustrating a top view of a chip package with multiple instances of the POEM of FIG. 1 in accordance with an embodiment of the present disclosure.

As shown in FIG. 2, which presents a block diagram illustrating a top view of a chip package 200, there may be multiple instances of the POEM. In some embodiments, alternate POEMs are used for transmitting or receiving. For example, odd instances of integrated circuits 110 may transmit and even instances of integrated circuits 110 may receive. This architecture may increase the computing performance and I/O bandwidth of chip package 200. In these embodiments, electrical signals may be routed between the chips using interposer 118-1. Note that the modular configuration of chip package 200 allows the POEM units to be fully testable prior to assembly into chip package 200. The ability to use such known-good components in a multi-chip module can have a significant impact on the overall yield.

Figure 3:
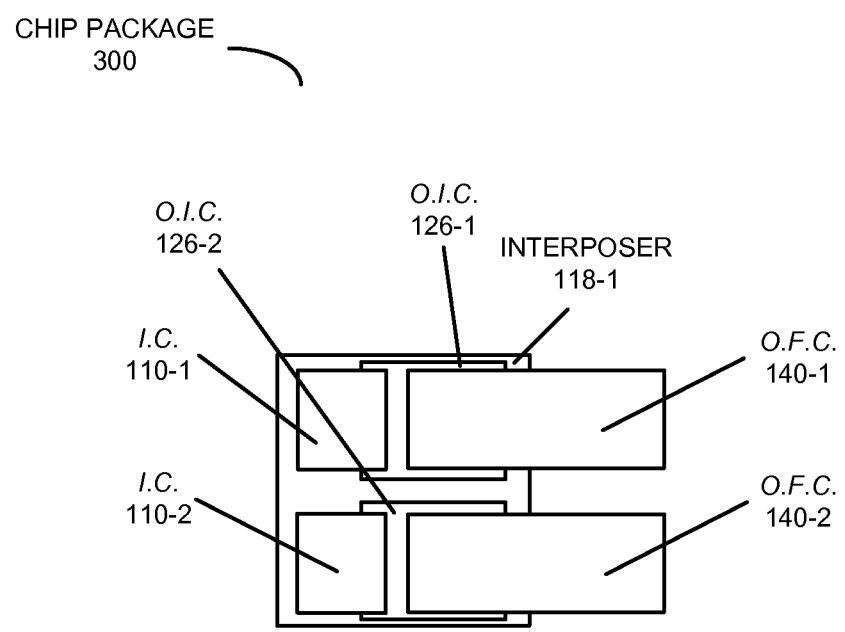
FIG. 3 is a block diagram illustrating a top view of a chip package with a POEM in accordance with an embodiment of the present disclosure.
Figure 4:
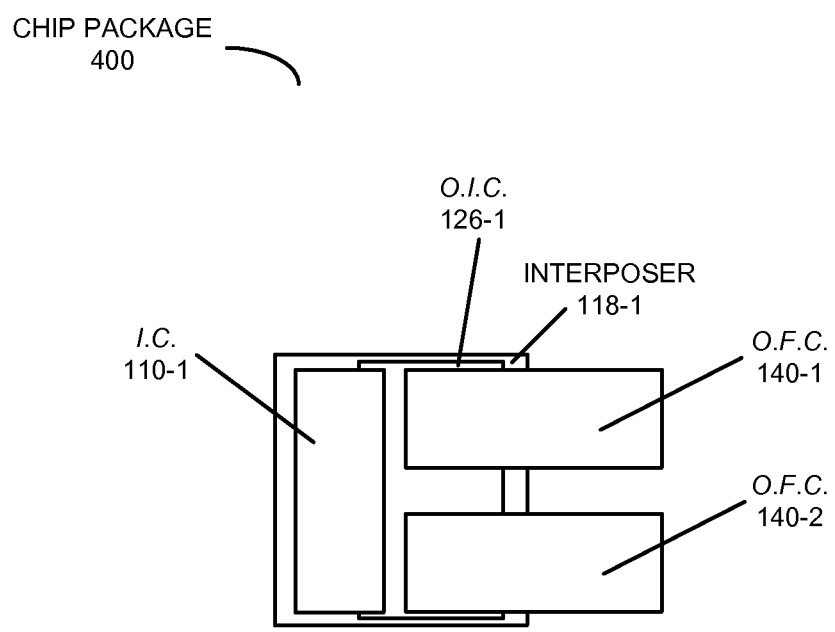
FIG. 4 is a block diagram illustrating a top view of a chip package with a POEM in accordance with an embodiment of the present disclosure.

In addition, as shown in FIG. 3, which presents a block diagram illustrating a top view of a chip package 300 with a POEM, when integrated circuit 110-1 transmits data, chip package 300 may include integrated circuit 110-2. This integrated circuit may receive data. Moreover, integrated circuit 110-2 may have a front surface (which is analogous to surface 112 in FIG. 1) with two sets of integrated-circuit connector pads (which may be similar to integrated-circuit connector pads 114 in FIG. 1), which are coupled to corresponding interposer connector pads (which may be similar to interposer connector pads 124 in FIG. 1) on a top surface (which is analogous to surface 122 in FIG. 1) and optical-integrated-circuit connector pads (which may be similar to optical-integrated-circuit connector pads 132 in FIG. 1) on a top surface (which is analogous to surface 130 in FIG. 1) by integrated-circuit electrical connectors (which may be similar to integrated-circuit electrical connectors 116 in FIG. 1). Alternatively, as shown in FIG. 4, which presents a block diagram illustrating a top view of a chip package 400 with a POEM, a single integrated circuit 110-1 and/or a single optical integrated circuit 126-1 may transmit and receive data.

Figure 5:
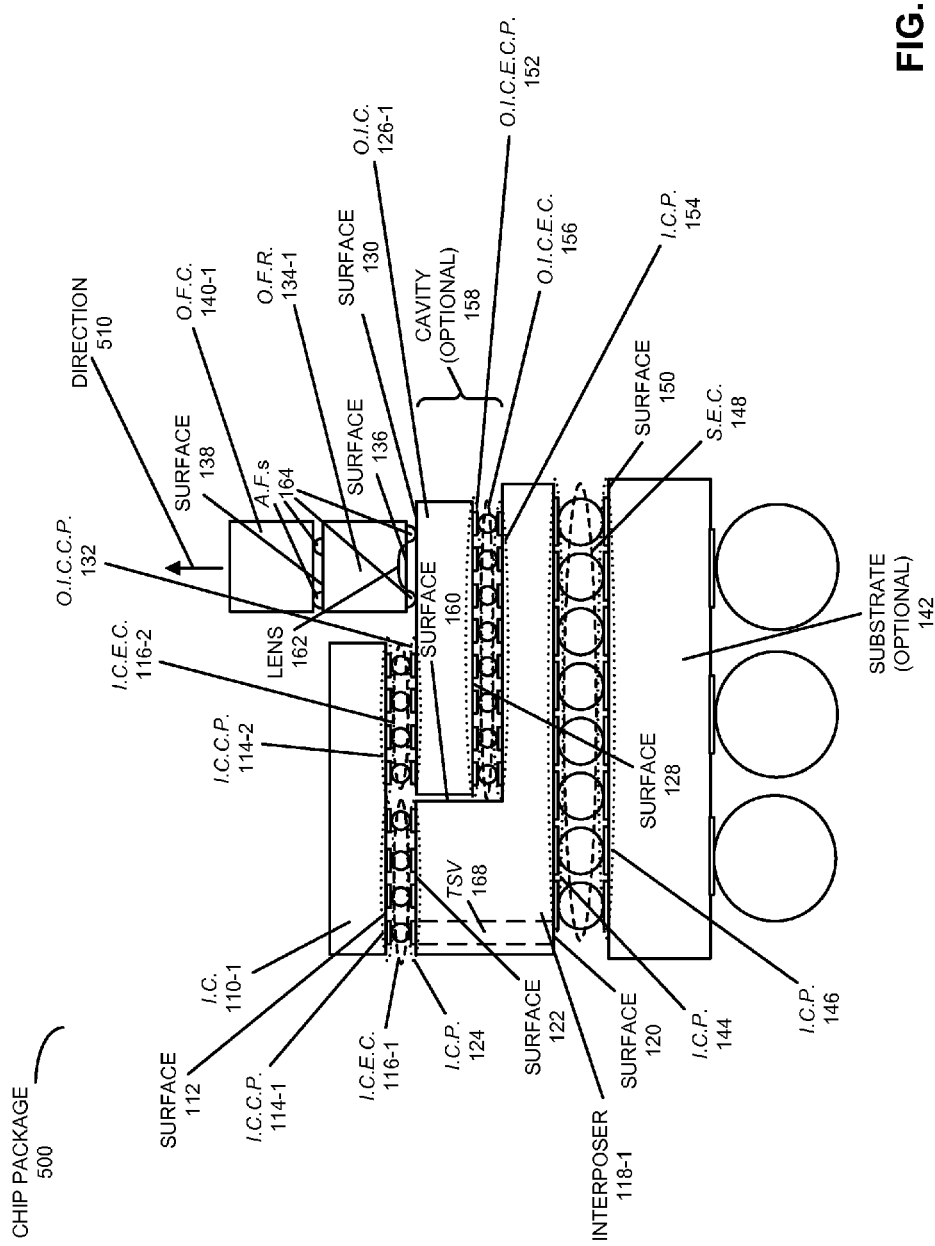
FIG. 5 is a block diagram illustrating a side view of a chip package with a POEM in accordance with an embodiment of the present disclosure.

Note that the optical-fiber connector may horizontally (or edge) couple to an optical fiber. In particular, as shown in FIG. 1, optical-fiber connector 140-1 may be a horizontal optical-fiber connector that mechanically and optically couples to the optical fiber along a direction 166 in a plane of interposer 118-1. Alternatively, the optical-fiber connector may be vertically couple to the optical fiber. This is shown in FIG. 5, which presents a block diagram illustrating a side view of a chip package 500 with a POEM. In particular, optical-fiber connector 140-1 may a vertical optical-fiber connector that mechanically and optically couples to the optical fiber along a direction 510 perpendicular to a plane of interposer 118-1.

Figure 6:
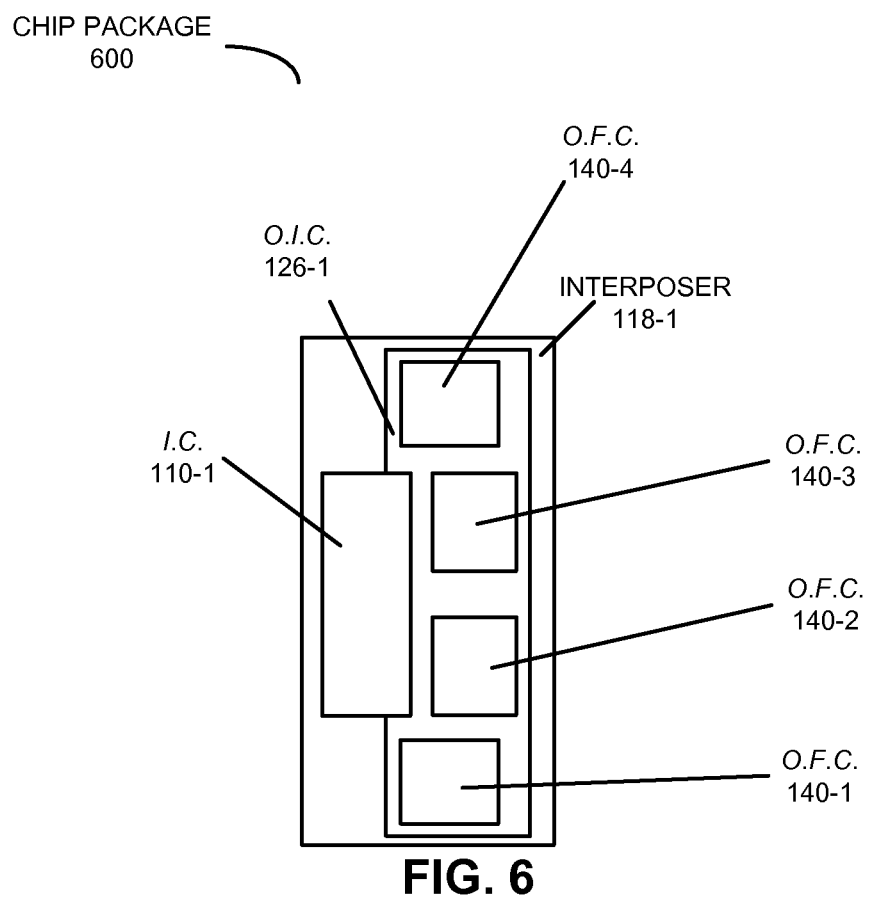
FIG. 6 is a block diagram illustrating a top view of a chip package with a POEM in accordance with an embodiment of the present disclosure.

Additionally, in some embodiments the chip package includes multiple instances of optical-fiber receptacle 134-1 and optical-fiber connector 140-1, which are optically coupled to optical integrated circuit 126-1. This is shown in FIG. 6, which presents a block diagram illustrating a top view of a chip package 600 with a POEM.

Note that the optical fiber may be used to bring in light from an off-package optical source (e.g., one or more lasers). Alternatively, an optical source may be included on optical integrated circuit 126-1. In some embodiments, the chip package includes a thermal-cooling mechanism on a surface of integrated circuit 110-1 on an opposite side of integrated circuit 110-1 from surface 112. This optional thermal-cooling mechanism may include a heat sink. Moreover, the heat sink may extend beyond integrated circuit 110-1 to interface other chips on the chip-package. In addition, it may have some topology if the chips have different heights. However, in some embodiments the optional thermal-cooling mechanism may be implemented using optional substrate 142. More generally, thermal management in the chip package may include: heat-spreaders, package lids and/or heat sinks.

Figure 7:
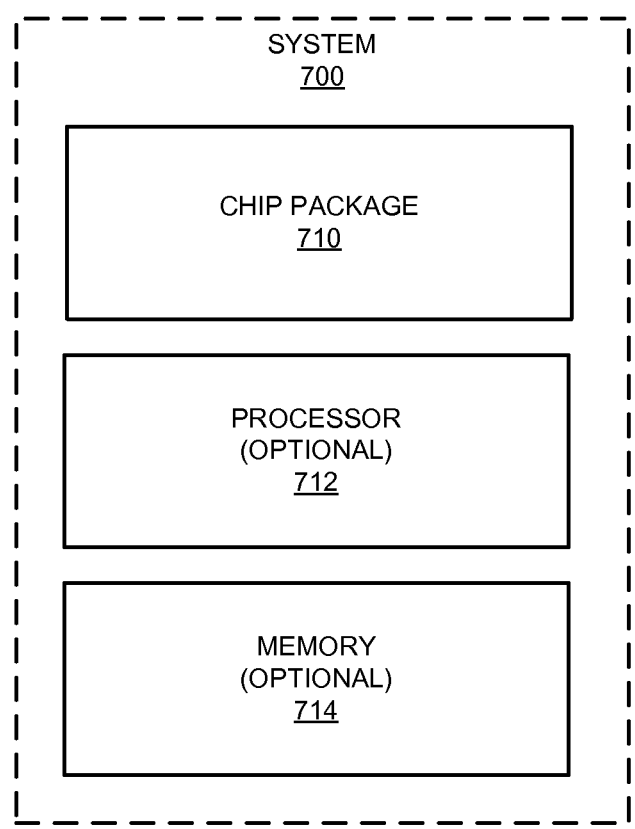
FIG. 7 is a block diagram illustrating a system that includes a chip package in accordance with an embodiment of the present disclosure.

Embodiments of the chip package may be used in a wide variety of applications. FIG. 7 presents a block diagram illustrating a system 700 that includes a chip package 710, such as one of the preceding embodiments of the chip package. This system may include an optional processor 712 and/or an optional memory 714, which may be coupled to each other and chip package 710 by a bus (not shown). Note that optional processor (or processor core) 712 may support parallel processing and/or multi-threaded operation.

Optional memory 714 in system 700 may include volatile memory and/or non-volatile memory. More specifically, optional memory 714 may include: ROM, RAM, EPROM, EEPROM, flash, one or more smart cards, one or more magnetic disc storage devices, and/or one or more optical storage devices. Moreover, optional memory 714 may store an operating system that includes procedures (or a set of instructions) for handling various basic system services for performing hardware-dependent tasks. Moreover, optional memory 714 may also store communications procedures (or a set of instructions) in a communication module. These communication procedures may be used for communicating with one or more computers, devices and/or servers, including computers, devices and/or servers that are remotely located with respect to the system 700.

Furthermore, optional memory 714 may also include one or more program modules (or sets of instructions). Note that the one or more program modules may constitute a computer-program mechanism. Instructions in the various modules in optional memory 714 may be implemented in: a high-level procedural language, an object-oriented programming language, and/or in an assembly or machine language. The programming language may be compiled or interpreted, i.e., configurable or configured, to be executed by optional processor (or processor core) 712.

System 700 may include, but is not limited to: a server, a laptop computer, a communication device or system, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, an electronic device, and/or another electronic computing device.

Note that embodiments of the chip package may be used in a variety of applications, including: VLSI circuits, communication systems (such as in wavelength division multiplexing), storage area networks, data centers, networks (such as local area networks), memory systems and/or computer systems (such as multiple-core processor computer systems). For example, the chip package may be included in a backplane that is coupled to multiple processor blades, or the chip package may couple different types of components (such as processors, memory, input/output devices, and/or peripheral devices). Thus, the chip package may perform the functions of: a switch, a hub, a bridge, and/or a router.

In general, system 700 may be at one location or may be distributed over multiple, geographically dispersed locations. Moreover, some or all of the functionality of system 700 may be implemented in one or more application-specific integrated circuits (ASICs) and/or one or more digital signal processors (DSPs). Furthermore, functionality in the preceding embodiments may be implemented more in hardware and less in software, or less in hardware and more in software, as is known in the art.

The preceding embodiments may include fewer components or additional components. For example, components in the chip package may be electrically coupled to each other using proximity-communication (PxC) connectors on surfaces of the components, such as: capacitive PxC connectors, inductive PxC connectors, conductive PxC connectors, and/or optical PxC connectors. Alternatively or additionally, the connectors may include compression-compliant microspring connectors. Moreover, components or features in one embodiment may be used in another of the embodiments.

In some embodiments, the interposer in the preceding embodiments includes passive components (such as capacitors, power and ground planes, etc.) to decouple the electrical signals. However, in other embodiments the interposer includes active circuits, such as those used for signal conditioning.

The chip package may also include additional features that facilitate assembly and that may help maintain in-plane (XY) alignment of components. In particular, components (such as integrated circuit 110-1 and/or optical integrated circuit 126-1 in FIG. 1) may be mechanically coupled to each other by pairs of negative features on surfaces and positive features that mate with the corresponding pairs of negative features. For example, the negative features may include pits that are recessed below surfaces 112 and 122 in FIG. 1, and the positive features may include spherical balls that mate with the negative features (such as a ball-and-etch-pit structure), thereby aligning the components. (Alternatively or additionally, alignment in the chip package may be facilitated using positive features on surfaces 112 and 122 in FIG. 1, where these positive features protrude above these surfaces). In some embodiments, the pairs of negative features are proximate to corners of the components.

As noted above, mating the negative features and the positive features can provide highly accurate self-alignment in the XY plane of the components, as well as coplanarity control during assembly. For example, the alignment over surfaces 112 and 122 in FIG. 1 may be within ±0.5 µm in the XY plane.

In some embodiments, components in the chip package are permanently attached after remateable alignment, for example, by using a post-alignment technique to permanently fix the chip-to-chip alignment. In particular, solder may be partially melted or reflowed at an elevated temperature to fuse components in the chip package to create a more permanent bond. However, in other embodiments, components in the chip package are remateably coupled, thereby facilitating rework of the chip package.

Moreover, although the chip package and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

Note that surfaces on components should be understood to include surfaces of substrates or surfaces of layers deposited on these substrates (such as a dielectric layer deposited on a substrate). Additionally, note that components in the chip package may be fabricated, and the chip package may be assembled, using a wide variety of techniques, as is known to one of skill in the art.

Figure 8:
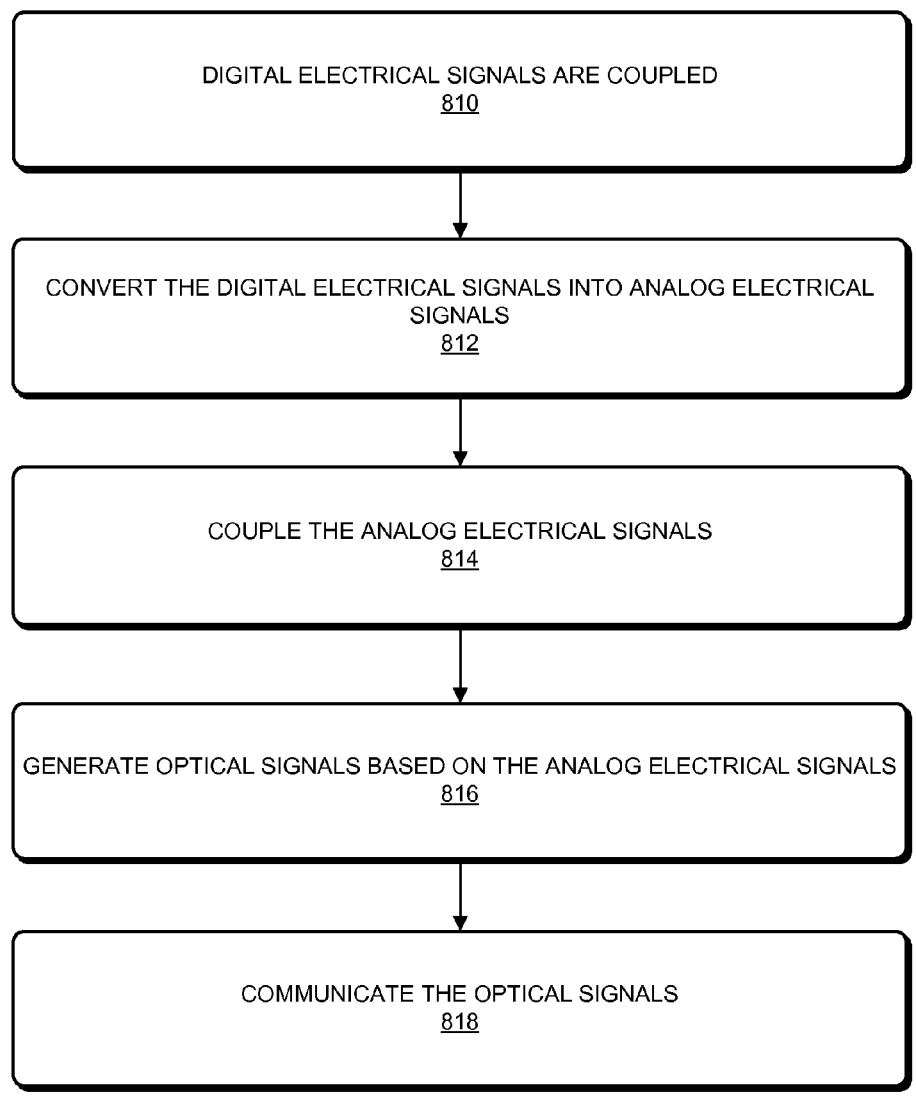
FIG. 8 is a flow diagram illustrating a method for communicating electrical signals between an integrated circuit and an optical integrated circuit in accordance with an embodiment of the present disclosure.

We now describe the method. FIG. 8 presents a flow diagram illustrating a method for communicating electrical signals between an integrated circuit and an optical integrated circuit, such as an integrated circuit and an optical integrated circuit in one of the preceding embodiments of the chip package. During the method, digital electrical signals are coupled (operation 810) from interposer connection pads on a top surface of an interposer to first integrated-circuit connector pads on a front surface of the integrated circuit. Then, the digital electrical signals are converted to analog electrical signals (operation 812). Moreover, the analog electrical signals are coupled (operation 814) from second integrated-circuit connector pads on the front surface of the integrated circuit to optical-integrated-circuit connector pads on a top surface of the optical integrated circuit. Next, optical signals are generated based on the analog electrical signals (operation 816). Furthermore, the optical signals are communicated (operation 818) to an optical fiber via an optical-fiber receptacle and an optical-fiber connector.

In some embodiments, method 800 includes additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
   an integrated circuit having a front surface with first integrated-circuit connector pads and second integrated-circuit connector pads, wherein the integrated circuit is configured to: modulate data, communicate data, and serialize/deserialize data;
   first integrated-circuit electrical connectors electrically coupled to the first integrated-circuit connector pads;
   an interposer having a bottom surface and a top surface, facing the front surface of the integrated circuit, with first interposer connector pads electrically coupled to the first integrated-circuit electrical connectors;
   second integrated-circuit electrical connectors electrically coupled to the second integrated-circuit connector pads;
   an optical integrated circuit having a bottom surface, facing the top surface of the interposer, and a top surface, facing the front surface of the integrated circuit, with first optical-integrated-circuit connector pads electrically coupled to the second integrated-circuit electrical connectors, wherein the optical integrated circuit is configured to communicate optical signals;
   an optical-fiber receptacle having a first surface and a second surface, wherein the first surface is mechanically and optically coupled to the top surface of the optical integrated circuit; and
   an optical-fiber connector mechanically and optically coupled to the second surface of the optical-fiber receptacle.

2. The chip package of claim 1, wherein the optical integrated circuit includes second optical-integrated-circuit connector pads on the bottom surface of the optical integrated circuit;
   wherein the interposer includes second interposer connector pads on the top surface of the interposer; and
   wherein the chip package further includes optical-integrated-circuit electrical connectors electrically coupled to the second optical-integrated-circuit connector pads and the second interposer connector pads.

3. The chip package of claim 1, wherein the interposer includes a cavity defined by a surface; and
   wherein the optical integrated circuit is at least partially included in the cavity.

4. The chip package of claim 1, wherein the optical-fiber receptacle includes a lens on at least one of: the first surface, and the second surface.

5. The chip package of claim 1, wherein the optical-fiber receptacle includes first alignment features on the first surface to facilitate alignment between the optical-fiber receptacle and the top surface of the optical integrated circuit; and
   wherein the optical-fiber receptacle includes second alignment features on the second surface to facilitate alignment between the optical-fiber receptacle and the optical-fiber connector.

6. The chip package of claim 1, wherein the optical-fiber connector includes a vertical optical-fiber connector configured to mechanically and optically couple to an optical fiber along a direction perpendicular to a plane of the interposer.

7. The chip package of claim 1, wherein the optical-fiber connector includes a horizontal optical-fiber connector configured to mechanically and optically couple to an optical fiber along a direction in a plane of the interposer.

8. The chip package of claim 1, wherein the integrated circuit is configured to perform one of: transmitting data, receiving data, and transmitting and receiving data.

9. The chip package of claim 1, wherein the first integrated circuit is configured to transmit data; and
   wherein the chip package includes:
   a second integrated circuit having a front surface with third integrated-circuit connector pads and fourth integrated-circuit connector pads, wherein the second integrated circuit is configured to receive data;
   third integrated-circuit electrical connectors electrically coupled to the third integrated-circuit connector pads and second interposer connector pads on the top surface of the interposer; and
   fourth integrated-circuit electrical connectors electrically coupled to the fourth integrated-circuit connector pads and second optical-integrated-circuit connector pads on the top surface of the optical integrated circuit.

10. The chip package of claim 1, wherein the chip package further comprises a substrate thermally and electrically coupled to the bottom surface of the interposer.

11. The chip package of claim 10, wherein the interposer includes through-interposer vias electrically coupling the bottom surface of the interposer and the top surface of the interposer.

12. The chip package of claim 1, wherein the optical integrated circuit is implemented using silicon-on-insulator technology.

13. The chip package of claim 1, wherein the interposer includes one of: an organic material, a ceramic, glass, and a semiconductor.

14. The chip package of claim 1, wherein, with the exception of the optical fiber connector, the chip package is solder-reflow compatible up to 260 C.

15. A system, comprising:
   a processor;
   a memory coupled to the processor; and
   a chip package, wherein the chip package includes:
   an integrated circuit having a front surface with first integrated-circuit connector pads and second integrated-circuit connector pads, wherein the integrated circuit is configured to: modulate data, communicate data, and serialize/deserialize data;
   first integrated-circuit electrical connectors electrically coupled to the first integrated-circuit connector pads;

an interposer having a bottom surface and a top surface, facing the front surface of the integrated circuit, with first interposer connector pads electrically coupled to the first integrated-circuit electrical connectors;

second integrated-circuit electrical connectors electrically coupled to the second integrated-circuit connector pads;

an optical integrated circuit having a bottom surface, facing the top surface of the interposer, and a top surface, facing the front surface of the integrated circuit, with first optical-integrated-circuit connector pads electrically coupled to the second integrated-circuit electrical connectors, wherein the optical integrated circuit is configured to communicate optical signals;

an optical-fiber receptacle having a first surface and a second surface, wherein the first surface is mechanically and optically coupled to the top surface of the optical integrated circuit; and an optical-fiber connector mechanically and optically coupled to the second surface of the optical-fiber receptacle.

16. The system of claim 15, wherein the optical integrated circuit includes second optical-integrated-circuit connector pads on the bottom surface of the optical integrated circuit;

wherein the interposer includes second interposer connector pads on the top surface of the interposer; and wherein the chip package further includes optical-integrated-circuit electrical connectors electrically coupled to the second optical-integrated-circuit connector pads and the second interposer connector pads.

17. The system of claim 15, wherein the interposer includes a cavity defined by a surface; and wherein the optical integrated circuit is at least partially included in the cavity.

18. The system of claim 15, wherein the first integrated circuit is configured to transmit data;

wherein the chip package includes:

a second integrated circuit having a front surface with third integrated-circuit connector pads and fourth integrated-circuit connector pads, wherein the second integrated circuit is configured to receive data;

third integrated-circuit electrical connectors electrically coupled to the third integrated-circuit connector pads and second interposer connector pads on the top surface of the interposer; and fourth integrated-circuit electrical connectors electrically coupled to the fourth integrated-circuit connector pads and second optical-integrated-circuit connector pads on the top surface of the optical integrated circuit.

19. The system of claim 15, wherein the chip package further comprises a substrate thermally and electrically coupled to the bottom surface of the interposer.

20. A method for communicating data between an integrated circuit and an optical integrated circuit, wherein the method comprises:

coupling digital electrical signals from interposer connection pads on a top surface of an interposer to first integrated-circuit connector pads on a front surface of the integrated circuit;

converting the digital electrical signals to analog electrical signals;

coupling the analog electrical signals from second integrated-circuit connector pads on the front surface of the integrated circuit to optical-integrated-circuit connector pads on a top surface of the optical integrated circuit;

generating optical signals based on the analog electrical signals;

communicating the optical signals to an optical fiber via an optical-fiber receptacle and an optical-fiber connector; and coupling additional electrical signals from second interposer connection pads on the top surface of the interposer to second optical-integrated-circuit connector pads on a front surface of the optical integrated circuit.

* * * * *

UNITED STATES PATENT AND TRADEMARK OFFICE
CERTIFICATE OF CORRECTION

PATENT NO. : 9,678,271 B2  
APPLICATION NO. : 14/605650  
DATED : June 13, 2017  
INVENTOR(S) : Thacker et al.

Page 1 of 1

It is certified that error appears in the above-identified patent and that said Letters Patent is hereby corrected as shown below:

In the Specification

In Column 2, Line 57, delete "260" and insert -- 260°--, therefor.

In Column 5, Line 65, delete "260" and insert -- 260° --, therefor.

In the Claims

In Column 12, Line 56, in Claim 14, delete "260" and insert -- 260° --, therefor.

Signed and Sealed this  
Twenty-fourth Day of April, 2018

Andrei Iancu  
*Director of the United States Patent and Trademark Office*